United States Patent
Lee et al.

(10) Patent No.: US 11,050,034 B2
(45) Date of Patent: Jun. 29, 2021

(54) QUANTUM DOT LIGHT EMITTING DIODE AND QUANTUM DOT DISPLAY DEVICE INCLUDING THE SAME

(71) Applicant: LG Display Co., Ltd., Seoul (KR)

(72) Inventors: Tae-Yang Lee, Seoul (KR); Kyu-Nam Kim, Paju-si (KR); Sung-Il Woo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 181 days.

(21) Appl. No.: 15/700,610

(22) Filed: Sep. 11, 2017

(65) Prior Publication Data

US 2018/0123070 A1    May 3, 2018

(30) Foreign Application Priority Data

Nov. 1, 2016  (KR) .................. 10-2016-0144575

(51) Int. Cl.
| | |
|---|---|
| *H01L 51/50* | (2006.01) |
| *H01L 51/42* | (2006.01) |
| *H01L 21/02* | (2006.01) |
| *F21V 8/00* | (2006.01) |
| *G02F 1/13357* | (2006.01) |
| *H01L 27/32* | (2006.01) |

(52) U.S. Cl.
CPC ........ *H01L 51/5072* (2013.01); *G02B 6/0023* (2013.01); *G02F 1/1336* (2013.01); *H01L 21/02603* (2013.01); *H01L 27/3246* (2013.01); *H01L 27/3262* (2013.01); *H01L 51/426* (2013.01); *H01L 51/4266* (2013.01); *H01L 51/502* (2013.01); *H01L 51/5012* (2013.01); *Y02E 10/549* (2013.01)

(58) Field of Classification Search
CPC ........................................................ H01L 33/04
See application file for complete search history.

(56) References Cited

U.S. PATENT DOCUMENTS

| | | | |
|---|---|---|---|
| 2005/0206300 A1 | 9/2005 | Perlo et al. | |
| 2011/0284819 A1* | 11/2011 | Kang | B82Y 20/00 257/9 |
| 2012/0119193 A1* | 5/2012 | Sekiguchi | H01G 9/2004 257/40 |

FOREIGN PATENT DOCUMENTS

| | | |
|---|---|---|
| CN | 102255019 A | 11/2011 |
| CN | 105826483 A | 8/2016 |
| KR | 10-2007-0097255 A | 10/2007 |
| TW | 201119082 A | 6/2011 |

OTHER PUBLICATIONS

Office Action with English translation dated Sep. 28, 2018 issued in the corresponding Taiwanese Patent Application No. 106137795, pp. 1-11.

Extended European search report dated Feb. 20, 2018 in a counterpart application No. EP 17 19 8262.

(Continued)

*Primary Examiner* — Steven B Gauthier
*Assistant Examiner* — Christopher A Culbert
(74) *Attorney, Agent, or Firm* — Polsinelli PC

(57) ABSTRACT

A quantum dot (QD) light emitting diode comprising first and second electrodes facing each other; a QD emitting material layer between the first and second electrodes; and a semiconducting member acting as a hole transporting path in the QD emitting material layer is provided.

9 Claims, 9 Drawing Sheets

(56) References Cited

OTHER PUBLICATIONS

Patrick Chin et al: "Energy transfer in hybrid quantum dot light-emitting diodes", Journal of Applied Physics, American Institute of Physics, US, vol. 104, No. 1, Jul. 7, 2008, pp. 13108-4 to 13108-6.
Xin Li et al: "Efficient Perovskite Solar Cells Depending on TiO 2 Nanorod Arrays", ACS Applied Materials & Interfaces,vol. 8, No. 33, Aug. 9, 2016 (Aug. 9, 2016), pp. 21358-21365, XP055449823, US ISSN: 1944-8244, DOI: 10.1021/acsami.6b05971.
Office Action dated Feb. 26, 2019 with English translation issued in the corresponding Chinese Patent Application No. 201711027435.5, pp. 1-21.

\* cited by examiner

100

QUANTUM DOT LIGHT EMITTING DIODE AND QUANTUM DOT DISPLAY DEVICE INCLUDING THE SAME

CROSS-REFERENCE TO RELATED APPLICATION

This application claims priority to and the benefit of Republic of Korea Patent Application No. 10-2016-0144575 filed in the Republic of Korea on Nov. 1, 2016, which is hereby incorporated by reference.

BACKGROUND

Field of the Disclosure

The present disclosure relates to a quantum dot (QD) light emitting diode, and more particularly, to a QD light emitting diode having an excellent hole transporting property and a QD display device including the same.

Description of the Background

Recently, as society has entered in earnest upon an information age, a field of display devices that represent all sorts of electrical signals as visual images has been developed rapidly. For example, a flat panel display device, such as a liquid crystal display (LCD) device, a plasma display panel (PDP) device, a field emission display (FED) device, and an organic light emitting diode (OLED) device, has been introduced.

On the other hand, use of quantum dots (QD) to display devices has been researched or studied. In the QD, an electron in unstable state transitions from a conduction band to a valence band such that light is emitted. Since the QD has a high extinction coefficient and excellent quantum yield, strong fluorescent light is emitted from the QD. In addition, since the wavelength of the light from the QD is controlled by a size of the QD, entire visible light can be emitted by controlling the size of the QD.

FIG. 1 is a schematic view illustrating the related art QD light emitting diode.

As shown in FIG. 1, the QD light emitting diode 10 includes a first electrode 20, a second electrode 80 facing the first electrode 20, a QD emitting material layer (EML) 50 disposed between the first and second electrodes 20 and 80, a hole injection layer (HIL) 30 and a hole transporting layer (HTL) 40 located between the first electrode 20 and the QD EML 50, and an electron transporting layer (ETL) 60 and an electron injection layer (EIL) 70 positioned between the QD EML 50 and the second electrode 80.

For example, the first electrode 20 serves as an anode, and the second electrode 80 serves a cathode.

The QD EML 50 includes a plurality of quantum dots.

In the QD light emitting diode 10, the hole from the first electrode 20 is transported into the QD EML 50 through the HIL 30 and the HTL 40, and the electron from the second electrode 80 is transported into the QD EML 50 through the EIL 70 and the ETL 60.

Since the QD has high quantum yield, it is expected that the QD light emitting diode 10 also provides high emitting efficiency. However, the related art QD light emitting diode 10 does not provide the desired emitting efficiency.

SUMMARY

Accordingly, the present disclosure is directed to a QD light emitting diode and a QD display device including the same that substantially obviate one or more of the problems due to limitations and disadvantages of the prior art, and have other advantages.

A QD light emitting diode and a QD display device in the present disclosure have an excellent hole transporting property.

A QD light emitting diode and a QD display device in the present disclosure have excellent emitting efficiency.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

An aspect of the present disclosure is a quantum dot (QD) light emitting diode including first and second electrodes facing each other; a QD emitting material layer between the first and second electrodes; and a semiconducting member acting as a hole transporting path in the QD emitting material layer.

Another aspect of the present disclosure is a quantum dot (QD) display device having a light emitting diode including an anode and a cathode facing each other; a quantum dot emitting material layer between the anode and the cathode; and a hole transporting enhancing member in the quantum dot emitting material layer, wherein the hole transporting enhancing member has a conduction band level between about −6.5 and about −5.0 eV, and has a shape having an aspect ratio of at least 2.

It is to be understood that both the foregoing general description and the following detailed description are examples and are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Reference will now be made in detail to aspects of the disclosure, examples of which are illustrated in the accompanying drawings.

In the related art QD light emitting diode, the hole transporting property is decreased because of an energy level difference between the ETL and QD EML.

Figure 1:
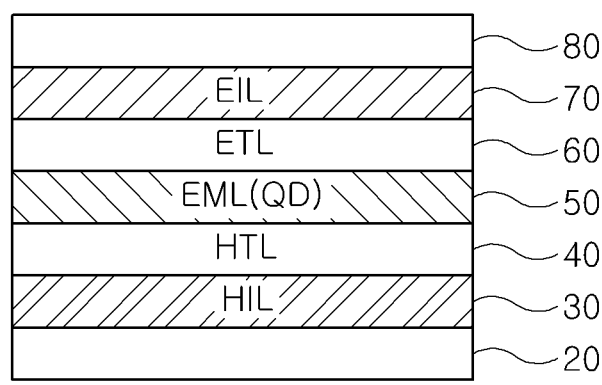
FIG. 1 is a schematic view illustrating the related art QD light emitting diode.
Figure 2:
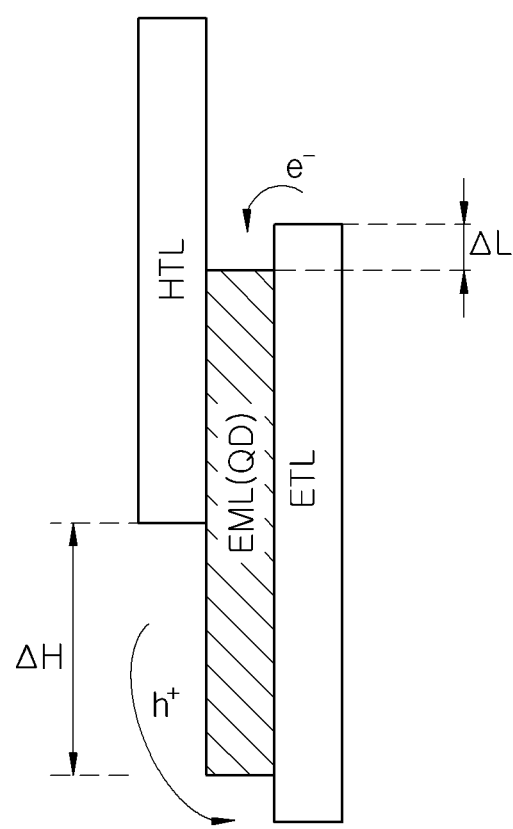
FIG. 2 is an energy diagram of the related art QD light emitting diode.

Namely, referring to FIG. 2, which is an energy diagram of the related art QD light emitting diode. Since the energy level difference "Δ L" between the QD EML and the ETL is small, the electron "e-" is easily or efficiently transported from the ETL into the QD EML.

However, since the energy level difference "Δ H" between the QD EML and the HTL is small, there is a limitation in the hole "h+" transporting from the HTL into the QD EML.

In addition, the ligand at a surface of the QD serves as a barrier, the hole transporting problem in the related art QD light emitting diode is further serious. Namely, the hole transporting into the QDs in a lower region, which is close to the HTL, of the QD EML is relatively easy, but the hole transporting into the QDs in an upper region, which is far from the HTL, of the QD EML is very difficult.

Accordingly, in the related art QD light emitting diode, a charge balance is lost, and the emitting efficiency is decreased.

Figure 3:
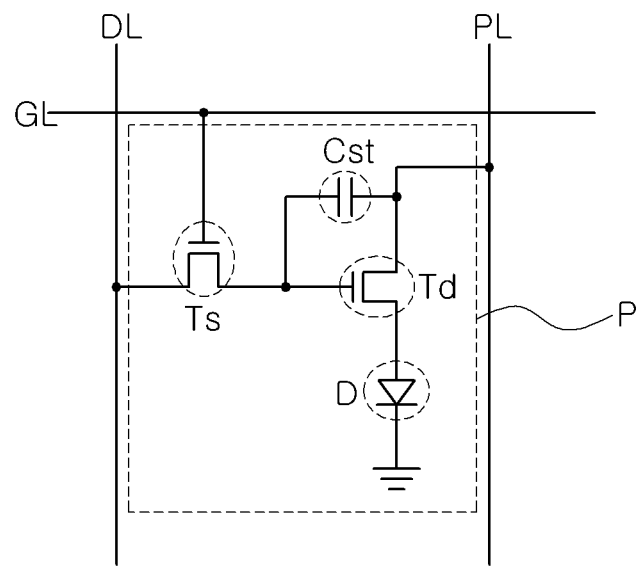
FIG. 3 is a schematic circuit diagram of a QD display device according to the present disclosure.

FIG. 3 is a schematic circuit diagram of a QD display device according to the present disclosure.

As shown in FIG. 3, in the QD display device, a gate line GL, a data line DL and a power line PL are formed, and a pixel region P is defined by the gate and data lines GL and DL. In the pixel region P, a switching thin film transistor (TFT) Ts, a driving TFT Td, a storage capacitor Cst and a QD light emitting diode D are formed.

The switching TFT Ts is connected to the gate line GL and the data line DL, and the driving TFT Td and the storage capacitor Cst are connected to the switching TFT Ts and the power line PL. The QD light emitting diode D is connected to the driving TFT Td.

In the QD display device, when the switching TFT Ts is turned on by a gate signal applied through the gate line GL, a data signal from the data line DL is applied to a gate electrode of the driving TFT Td and an electrode of the storage capacitor Cst through the switching TFT Ts.

When the driving TFT Td is turned on by the data signal, an electric current is supplied to the QD light emitting diode D from the power line PL through the driving TFT Td. As a result, the QD light emitting diode D emits light. The storage capacitor Cst serves to maintain the voltage of the gate electrode of the driving TFT Td for one frame. Accordingly, the electroluminescent display device displays images.

Figure 4:
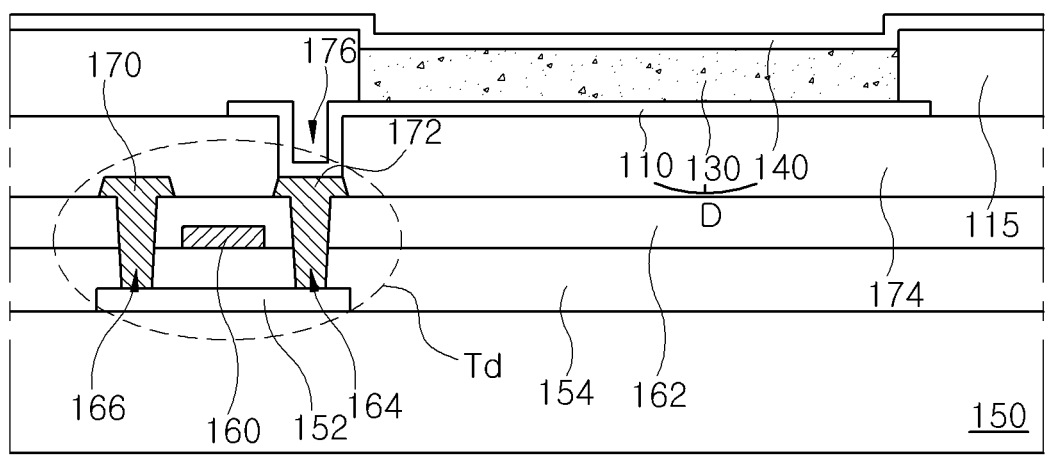
FIG. 4 is a schematic cross-sectional view of a QD display device according to the present disclosure.

FIG. 4 is a schematic cross-sectional view of a QD display device according to the present disclosure.

As shown in FIG. 4, the QD display device 100 includes a substrate 150, the TFT Td on the substrate 150 and the QD light emitting diode D over the substrate 150 and connected to the TFT Td.

The substrate 150 may be a glass substrate or a flexible substrate of a metal or a plastic. For example, the substrate 150 may be a polyimide substrate.

Although not shown, a buffer layer of an inorganic material, e.g., silicon oxide or silicon nitride, may be formed on the substrate 150.

The TFT Td is connected to the switching TFT Ts (shown in FIG. 3) and includes a semiconductor layer 152, a gate electrode 160, a source electrode 170 and a drain electrode 172.

The semiconductor layer 152 is formed on the substrate 150. The semiconductor layer 152 may be formed of an oxide semiconductor material or poly-silicon.

When the semiconductor layer 152 is formed of the oxide semiconductor material, a light-shielding pattern (not shown) may be formed under the semiconductor layer 152. Accordingly, the light to the semiconductor layer 152 is shielded or blocked by the light-shielding pattern such that thermal degradation of the semiconductor layer 152 can be prevented. On the other hand, when the semiconductor layer 152 is formed of the polycrystalline silicon, impurities may be doped into both sides of the semiconductor layer 152.

A gate insulating layer 154 is formed on the semiconductor layer 152. The gate insulating layer 154 may be formed of an inorganic insulating material such as silicon oxide or silicon nitride.

A gate electrode 160, which is formed of a conductive material, e.g., metal, is formed on the gate insulating layer 154 to correspond to a center portion of the semiconductor layer 152.

In FIG. 4, the gate insulating layer 154 is formed on the entire surface of the substrate 150. Alternatively, the gate insulating layer 154 may be patterned to have the same shape as the gate electrode 160.

An interlayer insulating layer 162, which is formed of an insulating material, is formed on the entire surface of the substrate 150 including the gate electrode 160. The interlayer insulating layer 162 may be formed of an inorganic insulating material, e.g., silicon oxide or silicon nitride, or an organic insulating material, e.g., benzocyclobutene or photo-acryl.

The interlayer insulating layer 162 includes first and second contact holes 164 and 166 exposing both sides of the semiconductor layer 152. The first and second contact holes 164 and 166 are positioned at both sides of the gate electrode 160 to be spaced apart from the gate electrode 160.

In FIG. 4, the first and second contact holes 164 and 166 extend into the gate insulating layer 154. Alternatively, when the gate insulating layer 154 is patterned to have the same shape as the gate electrode 160, there may be no first and second contact holes 164 and 166 in the gate insulating layer 154.

A source electrode 170 and a drain electrode 172, which are formed of a conductive material, e.g., metal, are formed on the interlayer insulating layer 162. The source electrode 170 and the drain electrode 172 are spaced apart from each other with respect to the gate electrode 160 and respectively contact both sides of the semiconductor layer 152 through the first and second contact holes 164 and 166. The source electrode 170 is connected to the power line PL (shown in FIG. 3).

The TFT Td including the semiconductor layer 152, the gate electrode 160, the source electrode 170 and the drain electrode 172 serves as a driving element.

The gate electrode 160, the source electrode 170 and the drain electrode 172 are positioned over the semiconductor layer 152. Namely, the TFT Td has a coplanar structure.

Alternatively, in the TFT Td, the gate electrode may be positioned under the semiconductor layer, and the source and drain electrodes may be positioned over the semiconductor layer such that the TFT Td may have an inverted staggered structure. In this instance, the semiconductor layer may be formed of amorphous silicon.

On the other hand, the switching TFT Ts (shown in FIG. 3) may have substantially the same structure as the TFT Td.

A passivation layer 174, which includes a drain contact hole 176 exposing the drain electrode 172 of the TFT Td, is formed to cover the TFT Td.

A first electrode 110, which is connected to the drain electrode 172 of the TFT Td through the drain contact hole 176, is separately formed on the passivation layer 174 in each pixel region. The first electrode 110 may be an anode and may be formed of a conductive material having a relatively high work function. For example, the first electrode 110 may be formed of a transparent conductive material such as indium-tin-oxide (ITO) and indium-zinc-oxide (IZO).

When the QD display device 100 of the present disclosure is a top-emission type, a reflection electrode or a reflection layer may be formed under the first electrode 110. For example, the reflection electrode or the reflection layer may be formed of an aluminum-palladium-copper (APC) alloy.

A bank layer 115, which covers edges of the first electrode 110, is formed on the passivation layer 174. The bank 115 exposes a center region of the first electrode 110 in the pixel region.

An emitting layer 130 is formed on the first electrode 110. The emitting layer 130 will be explained in more detail.

A second electrode 140 is formed on the emitting layer 130 over the substrate 150. The second electrode 140 is positioned at the entire surface of the display area. The second electrode 140 may be a cathode and may be formed of a conductive material having a relatively low work function. For example, the second electrode 140 may be formed of one of aluminum (Al), magnesium (Mg) and an Al—Mg alloy.

The first electrode 110, the emitting layer 130 and the second electrode 140 constitute the QD light emitting diode D.

In the QD light emitting diode D of the present disclosure, a QD EML in the emitting layer 130 may include a semiconductor rod such that a hole transporting property is improved. As a result, the emitting efficiency of the QD light emitting diode D and the QD display device 100 is also improved.

Figure 5:
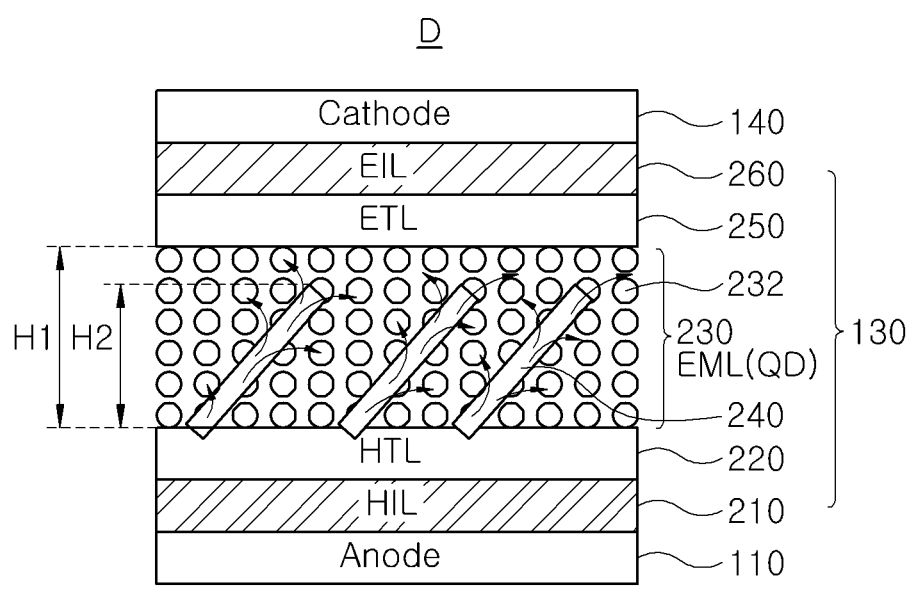
FIG. 5 is a schematic cross-sectional view of a QD light emitting diode according to the present disclosure.

FIG. 5 is a schematic cross-sectional view of a QD light emitting diode according to the present disclosure.

As shown in FIG. 5, the QD light emitting diode D includes the first electrode 110, the second electrode 140 facing the first electrode 110, a QD emitting material layer (EML) 230 between the first and second electrodes 110 and 140 and a semiconductor rod 240 (semiconducting member or hole transporting enhancing member) in the QD EML 230. The semiconductor rod 240 can be arranged to be inclined with respect to a surface (a lower surface or an upper surface) of the QD EML 230. Namely, the semiconductor rod 240 is not parallel or perpendicular to a surface of the QD EML 230.

The first electrode 110 may be an anode, and the second electrode 140 may be a cathode.

The QD EML 230 may include a plurality of QDs 232. The QD 232 may include a semiconductor material.

The QD 232 may include a core at a center region and a shell covering the core. The light is emitted from the core. In addition, a ligand for dispersing the QD 232 in the solvent may be combined at a surface of the shell. The core and the shell have a difference in an energy ban gap.

The QD 232 may be formed of a nano-size semiconductor material of II-VI group element or III-V group element. For example, the nano-size semiconductor material may be one of CdSe, CdS, CdTe, ZnSe, ZnTe, ZnS, HgTe, InAs, InP and GaAs.

In addition, the QD light emitting diode D may further include a hole transporting layer (HTL) 220 between the QD EML 230 and the first electrode 110. One end of the semiconductor rod 240 contacts the HTL 220, and the other end of the semiconductor rod 240 is positioned in the QD EML 230.

In other words, from the lower surface of the QD EML 230, the upper surface of the QD EML 230 has a first height H1, and the semiconductor rod 240 has a second height H2 being smaller than the first height H1.

The hole in the HTL 220 is directly transported into the QD EML 230 or is transported into the QD EML 230 through the semiconductor rod 240. Namely, the one end of the semiconductor rod 240 contacts the HTL 220 to serve as a hole transporting path. As a result, the hole is efficiently transported into a center region and an upper region of the QD EML 230 as well as the lower region of the QD EML 230.

The semiconductor rod 240 has a conduction band being smaller than the highest occupied molecular orbital (HOMO) level of the HTL 220 and being larger than the conduction band (or the HOMO level) of the QD EML 230. For example, the semiconductor rod 240 may include at least one of CdSe, CdS, ZnSe, AlAs, GaP and SiC. The conduction band of the semiconductor rod 240 is listed in Table 1.

TABLE 1

| | Conduction Band Level |
|---|---|
| CdSe | −5.8 eV |
| CdS | −6.2 eV |
| ZnSe | −6.1 eV |
| AlAs | −5.6 eV |
| GaP | −5.6 eV |
| SiC | −6.0 eV |

As shown in Table 1, the semiconductor rod 240 has the conduction band level of about −6.5 to −5.0 eV.

As a result, an energy barrier between the HTL 220 and the QD EML 230 is reduced, and the hole transporting property into the QD EML 230 is improved.

Figure 6:
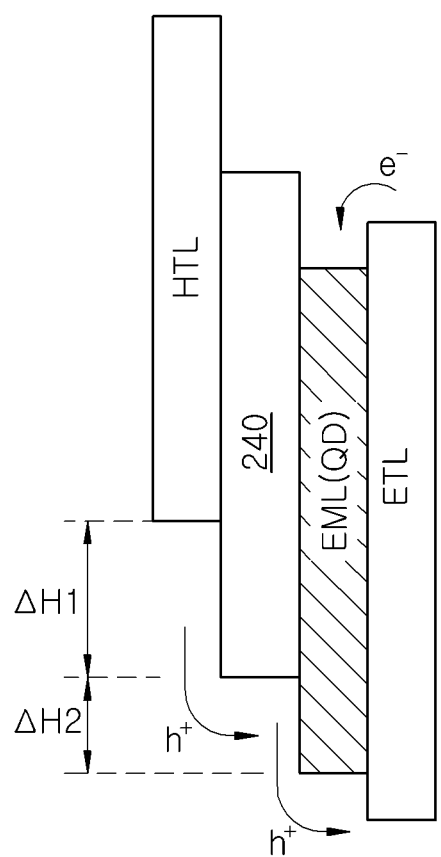
FIG. 6 is an energy diagram of a QD light emitting diode according to the present disclosure.

FIG. 6 illustrates an energy diagram of a QD light emitting diode according to the present disclosure.

As shown in FIG. 6, the semiconductor rod 240 has a conduction band being smaller than the HOMO level of the HTL and being larger than the conduction band (or the HOMO level) of the QD EML. Since the hole "h+" is transported into the QD EML via a relatively small energy gap "Δ H1" between the HTL and the semiconductor rod 240 and a relatively small energy gap "Δ H2" between the semiconductor rod 240 and the QD EML, the hole mobility is improved.

On the other hand, the electron "e-" transporting from an electron transporting layer (ETL) into the QD EML is not blocked by the semiconductor rod 240. Accordingly, in the QD light emitting diode D, the charge balance is improved, and the emitting efficiency is increased.

Referring back to FIG. 5, the semiconductor rod 240 has a major axis and a minor axis. Namely, the semiconductor rod 240 has an aspect ratio being greater than 1. Further, the aspect ratio of the semiconductor rod 240 can be greater than 2. For example, the aspect ratio of the semiconductor rod 240 may be about 2 to 10.

When the aspect ratio of the semiconductor rod 240 is too small, an area of the HTL 220 covered by the semiconductor rod 240 is increased. In addition, the other end of the semiconductor rod 240 is positioned in a center region of the QD EML 230. As a result, there is a limitation in the hole transporting into the QD 232 in the upper region of the QD EML 230.

The QD light emitting diode D may further include the ETL 250 between the QD EML 230 and the second electrode 140. In this instance, the semiconductor rod 240 may be spaced apart from the ETL 250.

Namely, the one end of the semiconductor rod 240 contacts the HTL 220, and the other end of the semiconductor rod 240 is spaced apart from ETL 250.

When the semiconductor rod 240 contacts the ETL 250, the hole from the HTL 220 is transported into the ETL 250 through the semiconductor rod 240 such that the hole does not participate in the emission of the QD EML 230. However, in the QD light emitting diode D of the present disclosure, since the semiconductor rod 240 is spaced apart from the ETL 250, the emitting efficiency of the QD light emitting diode D is further increased.

FIGS. 7A to 7D illustrate various shapes of a semiconductor rod.

Figure 7A:
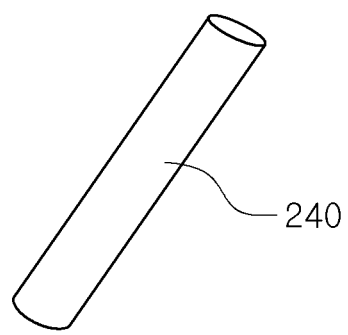
FIGS. 7A to 7D illustrate various shapes of a semiconductor rod.

As shown in FIG. 7A, the semiconductor rod 240 has a cylinder shape having a major axis and a minor axis. In this instance, one end of the cylinder-shaped semiconductor rod 240 may contact the HTL 220 (shown in FIG. 5), and the other end of the cylinder-shaped semiconductor rod 240 may be spaced apart from the ETL 250 (shown in FIG. 5). Alternatively, the cross-section of the semiconductor rod 240 may have a rectangular (or square) shape such that the semiconductor rod 240 may have a rectangular (or square) pillar shape.

Figure 7B:
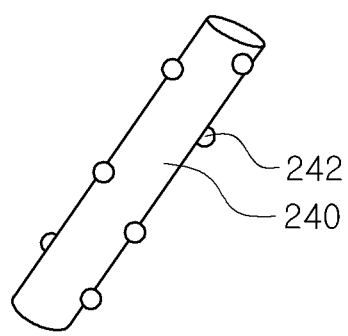

As shown in FIG. 7B, the semiconductor rod 240 may include protrusion patterns 242 at the surface. As a result, the hole transporting property into the QD 232 (shown in FIG. 5) in the center region of the QD EML 230 is improved. For example, a density of the protrusion patterns 242 in the center portion of the semiconductor rod 240 may be higher than that in the ends of the semiconductor rod 240.

Figure 7C:
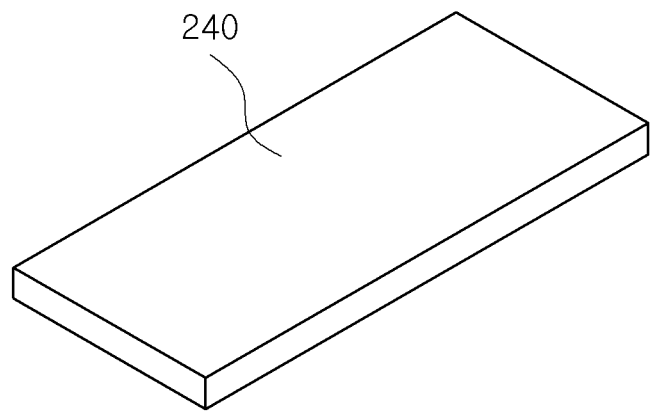

As shown in FIG. 7C, the semiconductor rod 240 may have a plate shape.

Figure 7D:
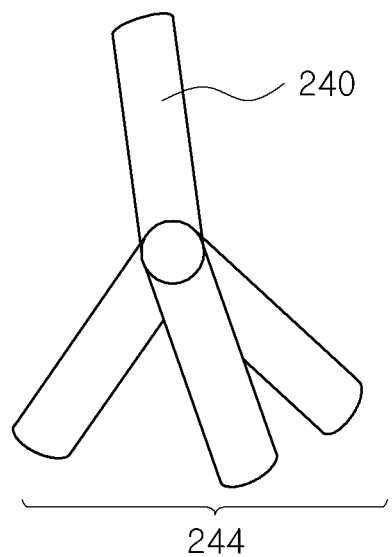

As shown in FIG. 7D, one end of the semiconductor rod 240 may be branched such that at least two hole transporting paths may be provided at the one end of the semiconductor rod 240. Namely, the semiconductor rod 240 has a branched-end 244. The branched-end 244 may contact the HTL 220 (shown in FIG. 5) such that the hole transporting from the HTL 220 into the semiconductor rod 240 may be improved. Alternatively, the branched-end 244 may be positioned in the QD EML 230 (shown in FIG. 5) such that the hole transporting from the HTL 220 into the QD EML 230 is improved.

In the present disclosure, when the "rod" has a major axis and a minor axis, there is no limitation in a shape. The major axis of the semiconductor rod 240 is inclined to the surface of the HTL 220, and one end of the major axis of the semiconductor rod 240 is positioned in the QD EML 230.

Referring back to FIG. 5, the QD light emitting diode D may further include a hole injection layer (HIL) 210 between the first electrode 110 and the HTL 220 and an electron injection layer (EIL) 260 between the second electrode 140 and the ETL 250.

The HIL 210, the HTL 220, the QD EML 230, the semiconductor rod 240, the ETL 250 and the EIL 260 constitute the emitting layer 130.

For example, the HIL 210 may be formed of one of poly(3,4-ethylenedioxythiophene) polystyrene sulfonate (PEDOT:PSS), and the HTL 220 may include at least one of N,N'-diphenyl-N,N'-bis(3-methylphenyl)-1,1'biphenyl-4, 4'diamine (TPD), poly(9-vinylcarbazole) (PVK), 4,4'-N, N'-dicarbazole-biphenyl (CBP), N,N'-bis(naphthalene-1-yl)-N,N'-bis(phenyl)benzidine ($\alpha$-NPD) and 4,4',4''-tris(N-carbazolyl)-triphenylamine (TCTA). The ETL 250 may be formed of at least one of 2,2',2''-(1,3,5-benzinetriyl)-tris(1-phenyl-1-H-benzimidazole) (TPBi) and 3-(4-biphenylyl)-4-phenyl-5-t-butylphenyl-1,2,4-triazole (TAZ), and the EIL 260 may include LiF. However, there is no limitation in a material of the HIL 210, the HTL 220, the ETL 250 and the EIL 260.

QD Light Emitting Diode

The QD light emitting diode including the first electrode of ITO, the HIL of PEDOT:PSS, the HTL of p-TPD and PVK, the semiconductor rod of CdSe, the QD EML of InP QDs (red emission), the ETL of TPBi, the EIL of LiF and the second electrode of Al is manufactured.

Figure 8A:
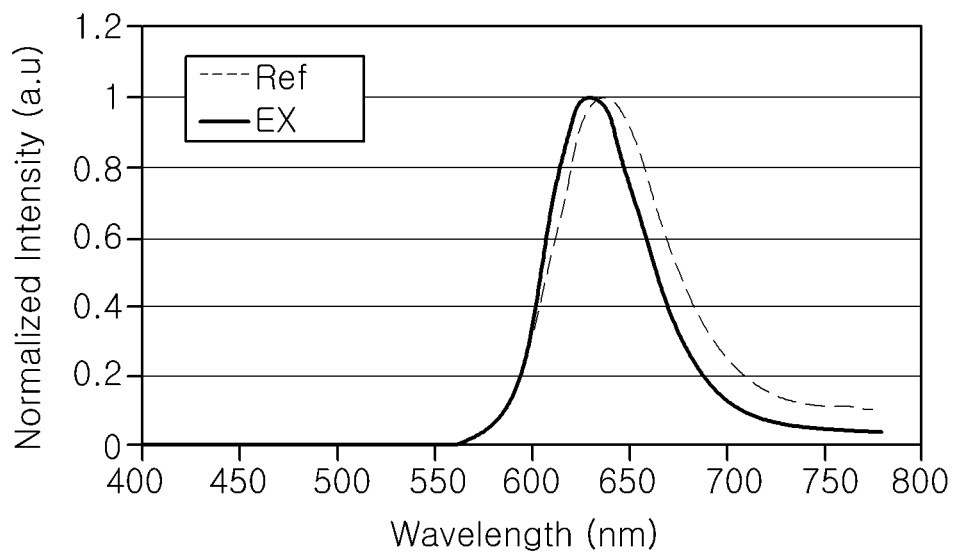
FIGS. 8A to 8C are graphs showing emitting properties of a QD light emitting diode according to the present disclosure.
Figure 8B:
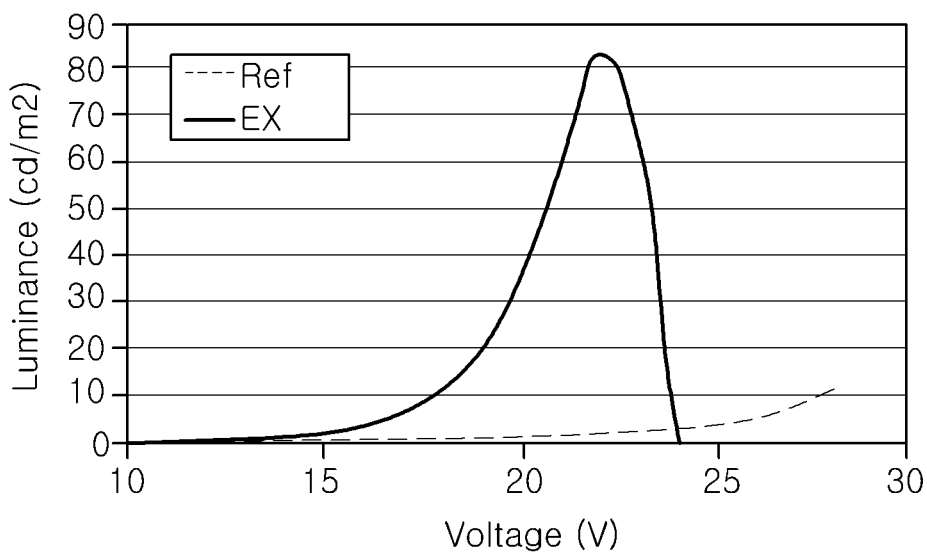
Figure 8C:
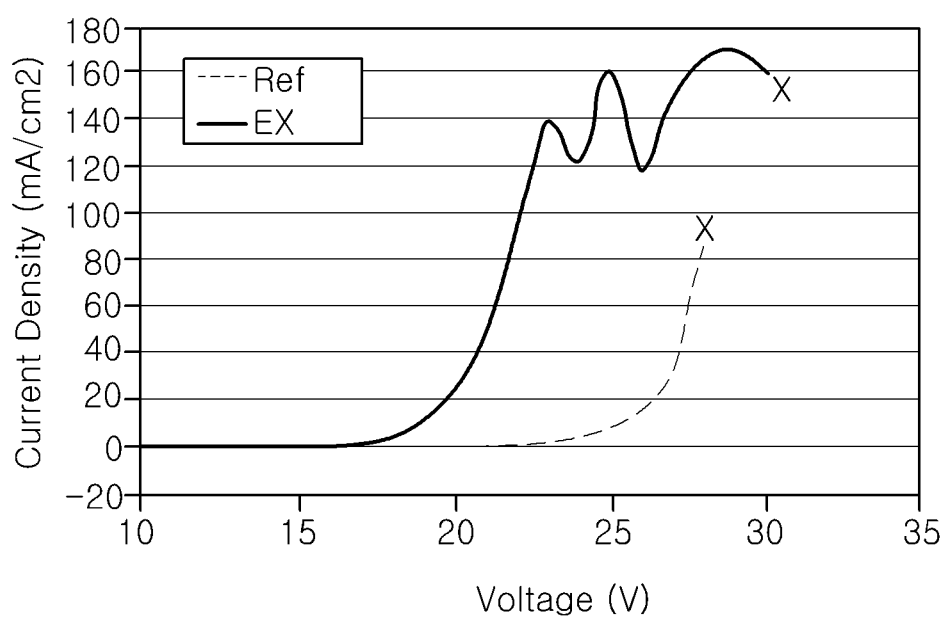

The emitting property of the QD light emitting diode is listed in Table 2 and shown in FIGS. 8A to 8C.

TABLE 2

|  | Turn On | | | | Max | | | |
| --- | --- | --- | --- | --- | --- | --- | --- | --- |
|  | Volt (V) | J (mA/cm$^2$) | EQE | Cd/m$^2$ | Volt (V) | J (mA/cm$^2$) | EQE | Cd/m$^2$ |
| Ref | 21 | 1.65 | 0.085 | 1.12 | 28 | 87.01 | 0.025 | 12.01 |
| Ex | 15 | 1.30 | 0.137 | 1.69 | 22 | 100.37 | 0.104 | 82.75 |

As shown in Table 2 and FIGS. 8A to 8C, in comparison to the QD light emitting diode (Ref), which does not include the semiconductor rod, the emitting property of the QD light emitting diode (Ex), which includes the semiconductor rod, is substantially improved. In addition, as shown in FIG. 8A, the semiconductor rod does not participate in the emission (no color shift).

As mentioned above, the QD light emitting diode D includes the semiconductor rod 240, which is positioned in the QD EML 230 to serve as a hole transporting path, such that the charge balance in the QD light emitting diode D is improved.

In addition, one end of the semiconductor rod 240 contacts the HTL 220, and the other end of the semiconductor rod 240 is positioned in the QD EML 230 to be spaced apart from the ETL 250. As a result, the hole transporting property into the QD EML 230 is uniformed and improved.

Accordingly, the emitting efficiency of the QD light emitting diode D and the QD display device 100 is improved.

It will be apparent to those skilled in the art that various modifications and variations can be made in the aspects of the disclosure without departing from the spirit or scope of the disclosure. Thus, it is intended that the present disclosure covers the modifications and variations of this disclosure provided they come within the scope of the appended claims and their equivalents.

What is claimed is:

1. A quantum dot (QD) light emitting diode, comprising:
first and second electrodes facing each other;
a QD emitting material layer between the first and second electrodes;
a hole transporting layer between the first electrode and the QD emitting material layer; and
a plurality of semiconductor rods each acting as a hole transporting path in the QD emitting material layer and inclined with respect to at least one of the first and second electrodes,
wherein each semiconductor rod has a first end within the hole transporting layer and a second end disposed within the QD emitting material layer, and the first end is spaced apart from the first electrode.

2. The QD light emitting diode according to claim 1, wherein each semiconductor rod has a conduction band level being smaller than a HOMO level of the hole transporting layer and being larger than a conduction band level of the QD emitting material layer.

3. The QD light emitting diode according to claim 1, wherein one end of each semiconductor rod has at least two paths.

4. The QD light emitting diode according to claim 1, wherein each semiconductor rod is disposed to be inclined with respect to at least one of upper and lower surfaces of the QD emitting material layer.

5. The QD light emitting diode according to claim 1, wherein an upper surface of the QD emitting material layer has a first height from a lower surface of the QD emitting material layer, and each semiconductor rod has a second height from the lower surface of the QD emitting material layer, and wherein the second height is smaller than the first height.

6. The QD light emitting diode according to claim 1, wherein each semiconductor rod has a shape having an aspect ratio equal to or greater than 2.

7. The QD light emitting diode according to claim 1, wherein each semiconductor rod includes a plate shape.

8. The QD light emitting diode according to claim 1, wherein each semiconductor rod has a protrusion pattern at a surface.

9. The QD light emitting diode according to claim 1, wherein each semiconductor rod includes at least one of CdSe, CdS, ZnSe, AlAs, GaP and SiC.

* * * * *